United States Patent [19]

Honjo

[11] Patent Number: 4,959,620

[45] Date of Patent: Sep. 25, 1990

[54] FREQUENCY DEMODULATION CIRCUIT

[75] Inventor: Masahiro Honjo, Neyagawa, Japan

[73] Assignee: Matsushita Electric Industrial Co., Ltd., Osaka, Japan

[21] Appl. No.: 408,220

[22] Filed: Sep. 18, 1989

[30] Foreign Application Priority Data

Sep. 19, 1988 [JP] Japan .................................. 63-233912

[51] Int. Cl.⁵ .............................................. H03D 3/02
[52] U.S. Cl. ................................... 329/327; 329/336; 329/342; 329/343; 360/30
[58] Field of Search ............... 329/327, 336, 341, 342, 329/343; 455/214; 360/30

[56] References Cited

U.S. PATENT DOCUMENTS

| 3,701,030 | 10/1972 | Gocho et al. | 329/336 |
| 3,748,586 | 7/1973 | Johnson et al. | 329/343 X |
| 4,064,361 | 12/1977 | Kustka et al. | 329/336 X |

FOREIGN PATENT DOCUMENTS 57-189311 11/1982 Japan .

Primary Examiner—Siegfried H. Grimm
Attorney, Agent, or Firm—Wenderoth, Lind & Ponack

[57] ABSTRACT

A frequency demodulation circuit disclosed superposes pulses on an input frequency-modulated (FM) signal at substantially peaks of the FM signal before demodulating the FM signal so that zero cross points of the FM signal can be correctly restored. A peak detection circuit detects peaks of the FM signal or peaks of the fundamental wave of the FM signal, which substantially correspond to the peaks of the FM signal. A pulse generating circuit generates, from the peak detection result, a train of pulses respectively occurring at the same timings as those of the detected peak occurrance timings. The generated train of pulses and the FM signal are respectively fed to differential inputs of a differential input type limiter. An output signal of the limiter is fed to a pulse count circuit to obtain a frequency demodulated signal.

31 Claims, 10 Drawing Sheets

FIG. 14
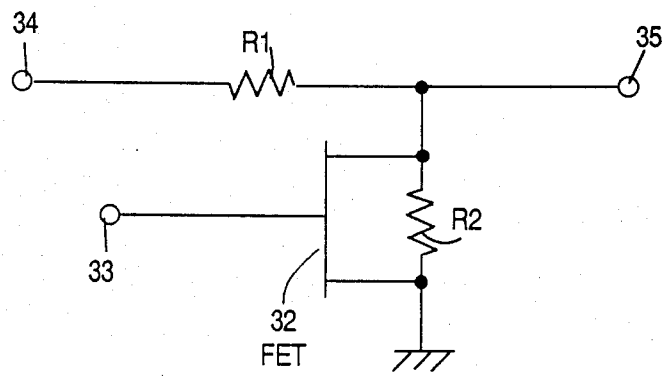
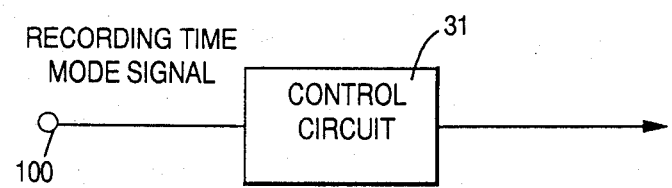
FIG. 15(A)
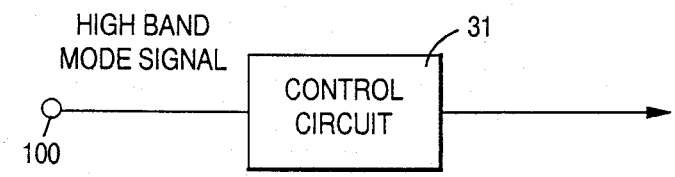
FIG. 15(B)
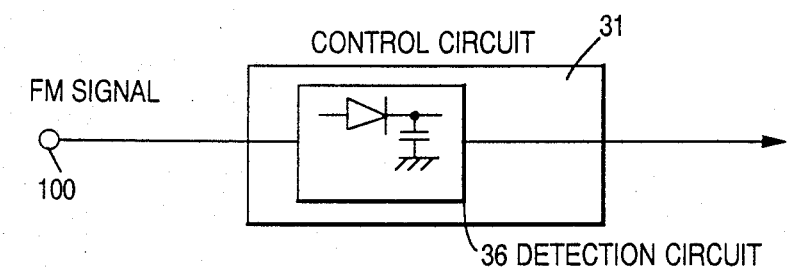
FIG. 15(C)
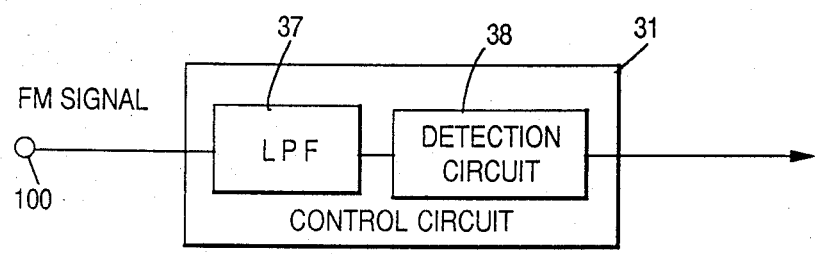
FIG. 15(D)

FREQUENCY DEMODULATION CIRCUIT

BACKGROUND OF THE INVENTION

1. Field of the Invention

This invention relates to a frequency demodulation circuit for demodulating a frequency-modulated (FM) signal.

2. Description of the Prior Art

In a magnetic recording and reproducing apparatus which performs low carrier FM recording and FM single side-band reproduction such as a commercial VTR, when the FM signal has a large frequency modulation index, zero cross points often cannot be reproduced with fidelity in an FM demodulator, so that a signal, inversion, or an inversion phenomenon is apt to occur. This phenomenon occurs when the level of lower side-band component $J_{-1}$ becomes greater than the level of the FM fundamental wave component $J_0$. Further, when the reproduced noise is overlapped, the inversion phenomenon occurs due to the influence of the noise even when $J_{-1} < J_0$.

To avoid the occurrence of this inversion phenomenon, a frequency demodulator disclosed in Japanese Laid-Open Patent publication 57-189311 (1982) superposes pulses on an input FM signal before demodulating the FM signal. The superposed pulses occur at timings delayed by a specific time from the zero cross points of the fundamental wave component of the FM signal. The specific time is set such that the pulses are superposed on the peak points of the FM signal at the carrier frequency. This operation will be described in more detail with reference to the block diagram shown in FIG. 18 and the waveform diagram shown in FIG. 19.

The fundamental wave component i of an input FM signal h is taken out by a band-pass filter 20, delayed by a prescribed time by a delay circuit 21 to be a signal j. The signal j is passed through a limiter 22 to obtain a signal k, from which pulse signals l are obtained by a pulse generation circuit 23. The pulse signals l indicate the zero cross points of the delayed fundamental wave signal j, which is a condition essentially different from that of the present invention. Further, by superposing the pulse signals l on the reproduced FM signal h by an adder 24, a signal m is obtained. Since a zero cross point exists at a point of high modulation index, the inversion phenomenon does not occur.

However, the pulse signals l represent the time information of the zero cross points of the signal j of the fundamental wave which is delayed by the prescribed time, while the time information of the peak points of the input FM signal waveform is essentially different time information. Thus, the addition of signals having different time information causes the information of the FM signal to be distorted, so that the following problems are caused.

If it is assumed that an FM allocation of a VTR is 5 to 7 MHz, dark clip is 100%, and white clip is 200%, then the dark clip frequency becomes 3 MHz, white clip frequency becomes 9 MHz, and the range where the fundamental wave exists becomes 3 to 9 MHz. That is to say, the inversion period of the fundamental wave will change between a range of approximately 333/2 nsec and 111/2 nsec.

When the fundamental wave signal i is delayed by 100 nsec to be the signal j, the pulse-superposed FM signal m indicates that the phase relation between the superposed pulses and the FM signal changes with frequency. That is, when the frequency of the fundamental wave signal i is low, the pulses are superposed on positions close to the peak points of the fundamental wave signal, but when the frequency of the fundamental wave signal is high, the pulses are superposed on positions shifted from the peak points of the fundamental wave signal. Therefore, the zero cross point cannot be restored at a point $X_1$, so that what is called the black break is generated. At a point $X_2$ where an excess zero cross is generated, what is called the white break is generated.

When the delay time is reduced to 50 nsec, the signal j, k, l, m, becomes as signals $j_2$, $k_2$, $l_2$, $m_2$, respectively.

The signal $m_2$ indicates that the white break is generated at the point $X_3$. When the delay time is further reduced, the pulse signals will be superposed closer to the zero cross area, so that the waveform at the zero cross points of the reproduced FM signal is changed. This will undesirably influence the frequency characteristic after demodulation. Therefore, mere reduction of the delay time is not desirable.

As described above, in the conventional frequency demodulator as disclosed in Japanese Laid-Open Patent publication 57-189311 (1982), the prevention of the invertion phenomenon cannot be achieved over the overall frequency range of the FM signal. Further, the superposed pulses cause deterioration of the FM signal waveform.

To solve the problems as described above, we developed a new frequency demodulator which superposes a pulse having a small width on each peak of an input FM signal as disclosed in a U.S. Patent Application of Ser. No. 189,169 filed on May 2, 1988, entitled "Frequency Demodulation Circuit", and in a corresponding European Patent Application No. 88303923.2 filed on Apr. 29, 1988. This new frequency demodulator successfully solved the above-mentioned problems. However, when the limited voltage range of the ordinary semiconductor integrated circuit (IC) is considered, a further improvement is needed. That is, to superpose a pulse on each peak of a FM wave causes an increase of the amplitude of the FM wave. The amplitude increase is not preferable when the frequency demodulator is fabricated in a semiconductor IC or the like. The present invention was made to solve this problem. The present invention was made to attain the same advantageous effects as those provided by the frequency demodulator disclosed in our earlier application mentioned above without causing the increase of the amplitude of the FM signal which is to be demodulated.

SUMMARY OF THE INVENTION

An object of the present invention is to provide a frequency demodulation circuit which performs accurate frequency demodulation without causing the inversion phenomena.

Another object of the present invention is to provide a frequency demodulation circuit which performs accurate frequency demodulation with high signal to noise ratio (S/N).

Still another object of the present invention is to provide a frequency demodulation circuit which does not cause an unnecessary increase of the amplitude of an FM signal during processing the FM signal.

To achieve these objects, according to the present invention, a differential input type limiter circuit is used. From an input FM signal a pulse train is produced in which a positive pulse having a small pulse width occurs at substantially the same timing as that of each negative peak of the input FM signal and a negative pulse having a small pulse width occurs at substantially the same timing as that of each positive peak of the input FM signal. The pulse train is applied to one input of the differential input type limiter circuit, and the input FM signal is applied to the other input of the same. An output signal from the differential input type limiter circuit contains the accurate FM information of the input FM signal even if the waveform of the input FM signal is largely degraded. The output signal from the differential input type limiter may be fed to a conventional pulse count circuit to obtain a frequency-demodulated signal.

A frequency demodulation circuit embodying the present invention comprises: a peak detection circuit for detecting peaks (both positive and negative peaks) of an input FM signal; a pulse generating circuit for generating, according to the detection result by the peak detection circuit, a pulse train containing positive pulses each occurring at a timing at which a negative peak of the input FM signal occurs and negative pulses each occurring at a timing at which a positive peak of the input FM signal occurs; a differential input type limiter circuit which receives at one input thereof the pulse train from the pulse generating circuit and at the other input thereof the input FM signal for limiting the input FM signal with the pulse train as a reference signal; and a pulse count circuit for producing a pulse at each edge of each pulse outputted from the differential input type limiter circuit to thereby obtain a frequency-demodulated signal.

With the above construction, it is possible to prevent an occurrence of the inversion phenomen in a wide frequency range without causing unnecessary increase of the signal amplitude. Thus, the frequency demodulation circuit of the present invention can be easily fabricated in a semiconductor IC or the like. Further, since the adder used in the conventional circuit described before is not necessary, the circuit can be simplified and the cost can be reduced.

Preferably, the peak detection circuit is replaced by a fundamental wave peak detection circuit which detects peaks of the fundamental wave of the input FM signal. Since the peaks of the fundamental wave are regarded substantially identical to the peaks of the FM signal, a train of pulses which occur substantially at the peaks of the FM signal can be obtained as the output of the pulse generating circuit. In this case, the fundamental wave peak detection circuit has a band-pass filter for extracting the fundamental wave component from the input FM signal. The band-pass filter has an effect to reduce noises.

The input FM signal may be passed, before being fed to the adder, through an equalizer for compensating for a signal delay caused in the peak detection and pulse generating circuits. The equalizer may have a low-pass filter characteristic to eliminate low S/N high band components of the FM signal.

A level adjusting circuit for adjusting the level of the pulses generated by the pulse generating circuit and a control circuit for controlling the level adjusting circuit according to a desired signal may be added to the frequency demodulation circuit for providing a further enhanced function.

The above and other objects, features and advantages of the present invention will be apparent from the following description of the preferred embodiments taken in connection with the accompanying drawings in which:

BRIEF DESCRIPTION OF THE DRAWINGS

FIG. 14 is a circuit diagram of the level adjustment circuit;

DESCRIPTION OF THE PREFERRED EMBODIMENTS

Figure 1:
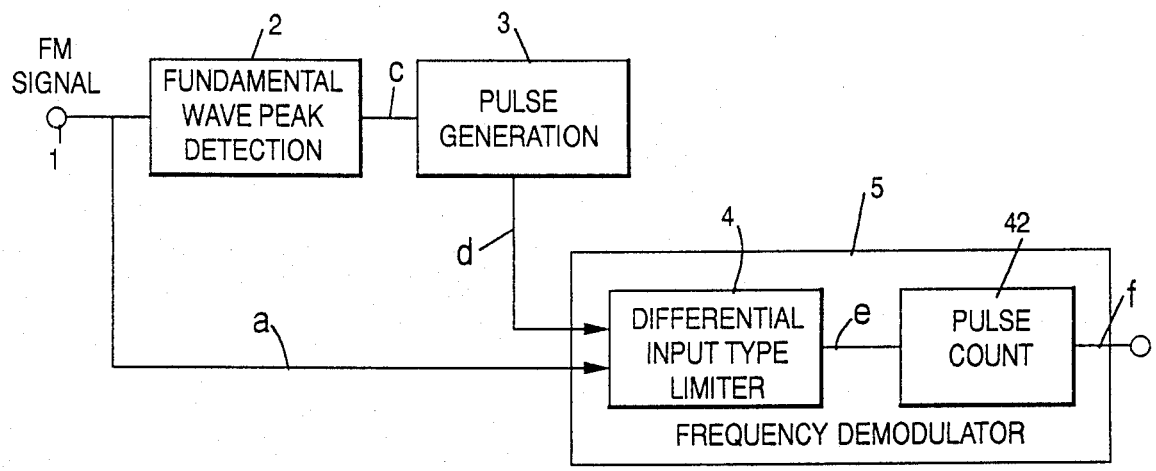
FIG. 1 is a block diagram of a first embodiment of the present invention.
Figure 2:
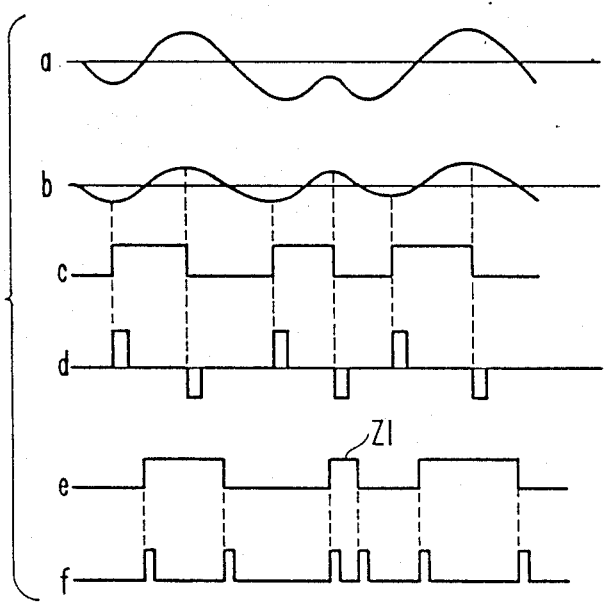
FIG. 2 is a waveform diagram of the first embodiment.

FIG. 1 shows a block diagram of a first embodiment of the present invention, and FIG. 2 shows waveform diagrams at corresponding portions a through e in the same diagram. An FM signal a inputted from a terminal 1 is fed into a fundamental wave peak detection circuit 2. The fundamental wave peak detection circuit 2 outputs a rectangular signal c whose transition edges indicate the peak points of the fundamental wave component b of the FM signal a. A pulse generation circuit 3 generates, from the signal c, pulses d of positive polarity at the rising edges of the signal c and of negative polarity at the falling edges of the signal c. The pulse generation circuit 3 may be a differentiation circuit.

The signals a and b are applied to a frequency demodulator 5 which comprises a differential input type limiter circuit 4 and a pulse count circuit 42. The differential input type limiter circuit 4 receives the signals a and d at its two differential input terminals respectively, and outputs a signal e which is a pulse train having the same frequency deviation information as that of the input FM signal a. If the input FM signal a were processed by an ordinary single input type limiter used in the conventional frequency demodulator, the pulse $Z_1$ of the signal e would not be obtained, and thus an inversion phenomenon would be caused, i.e., accurate demodulation could not be made. The pulse count circuit 42 receives the signal e and produces a pulse having a predetermined pulse width at each of rising and falling edges of the pulses of the signal e to obtain a frequency-demodulated signal f. The signal f will be integrated by a low-pass filter or the like in a subsequent circuit (not shown). The function of the pulse count circuit 42 has been well-known in the art.

Figure 3:
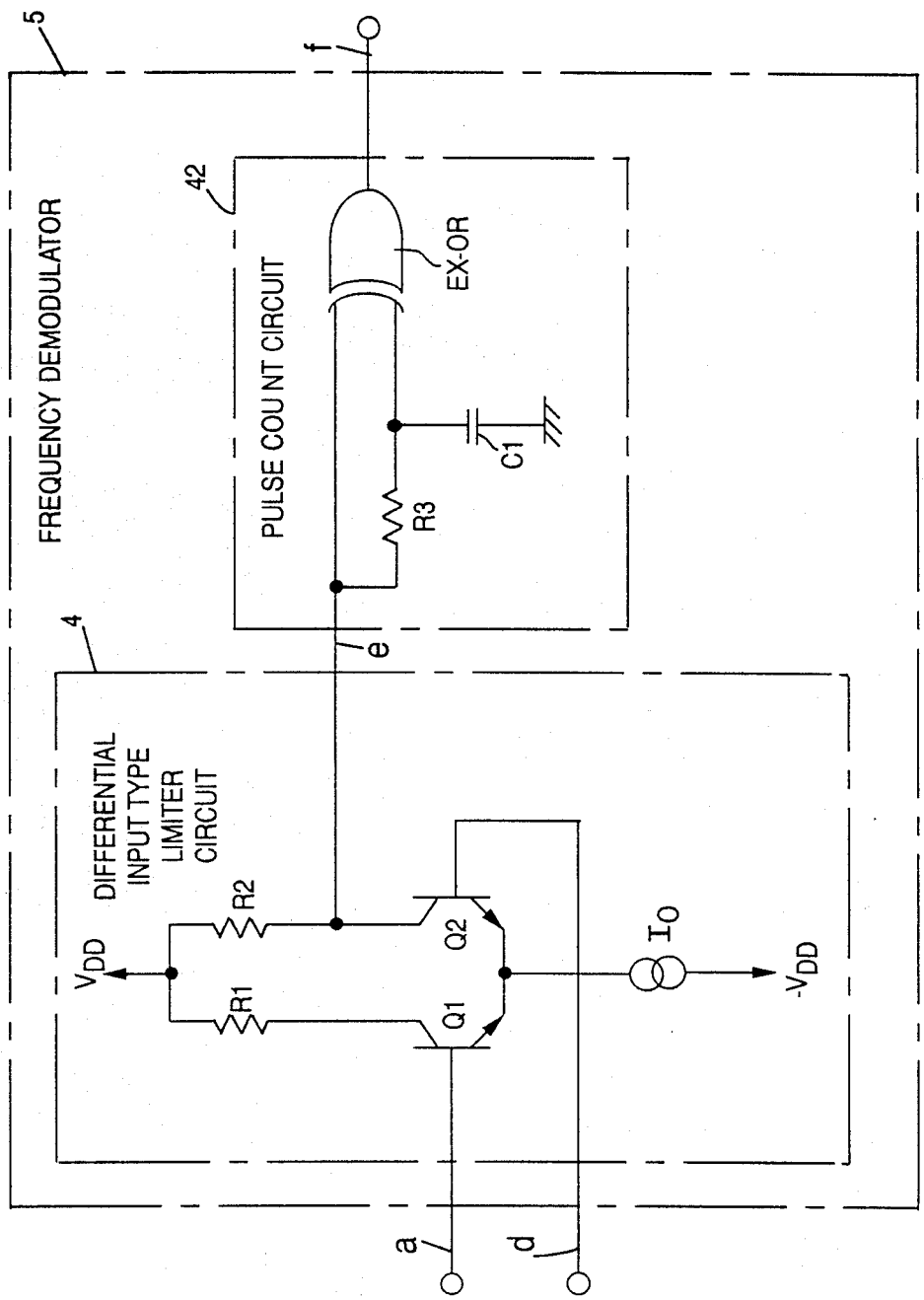
FIG. 3 is a circuit diagram showing a typical circuit configuration of a demodulator used in the present invention.
Figure 4:
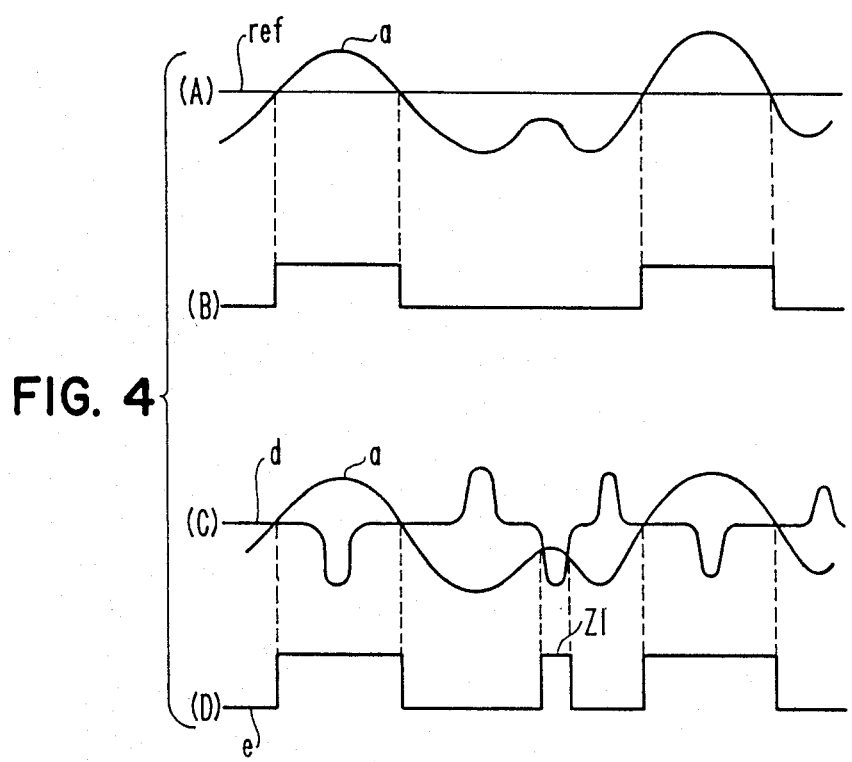
FIG. 4 is a waveform diagram for explaining the principle of the present invention.

FIG. 3 shows an example of configuration of the differential input type limiter circuit 4 and an example of configuration of the pulse count circuit 42. FIG. 4 shows waveform diagrams for explaining the operation principle of the differential input type limiter circuit 4 in comparison with the operation of the conventionally used single input type limiter. The conventional frequency demodulator is configured by a single input type limiter and a pulse count circuit. The single input type limiter compares the input FM signal a with a fixed reference level (ref) as shown in FIG. 4 (A), and produces a high level output when the signal a is higher than the fixed reference level and a low level output when the signal a is smaller than the fixed reference level as shown in FIG. 4 (B). Therefore, if the input FM signal a has a positive peak which is lower than the fixed reference level as shown in FIG. 4 (a), the information of such peak is lost in the output of the limiter as shown in FIG. 4 (a). In other words, the accurate FM information is lost, and thus accurate frequency demodulation cannot be performed. This problem can be solved by the present invention.

Referring to FIG. 3, the differential input type limiter circuit 4 comprises two transistors $Q_1$ and $Q_2$ which are connected at their respective collectors through resistors $R_1$ and $R_2$ to a positive voltage source $V_{DD}$, and at their respective emitters in common to a constant current source $I_0$. The input FM signal a is applied to the base of the transistor $Q_1$, and the signal d from the pulse generating circuit 3 is applied to the base of the transistor $Q_2$. When the level of the signal a is higher than that of the signal d, the transistor $Q_1$ turns on and the transistor $Q_2$ turns off, so that the voltage at the collector of the transistor $Q_2$ becomes high ($V_{DD}$). When the level of the signal a is lower than the level of the signal d, the transistor $Q_1$ turns off and the transistor $Q_2$ turns on, so that the voltage at the collector of the transistor $Q_2$ becomes low ($V_{DD}-I_0R_2$). The voltage at the collector of the transistor $Q_2$ is outputted as the signal e. The above operation is illustrated in FIG. 4 (C) and (D). As shown in FIG. 4 (C), even if the input FM signal a has a low amplitude positive peak, the signal d becomes lower than the signal a for a short time around the peak owing to the presence of the negative pulse. Thus, the information of the presence of such a small peak is accurately transmitted to the signal e as the pulse $Z_1$ for example. In other words, accurate frequency demodulation can be performed. Further, no necessary increase of the amplitude of the FM signal is caused.

The above described operation of the differential input type limiter circuit can be considered also as follows. That is, when comparing an input signal with a reference level, the reference level is adaptively changed according to the input signal thereby to perform limiter operation. The signal d, which is the reference level, is changed according to the peak information of the input FM signal a. Accordingly, accurate FM information can be obtained from the input FM signal having a degraded waveform. The above operation principle may be realized by various circuit configurations including the one shown in FIG. 3.

The pulse count circuit 42 shown in FIG. 3 is configured by a delay circuit composed of a resistor $R_3$ and a capacitor $C_1$, and an exclusive-OR circuit EX-OR. The operation of the circuit is self-explanatory, and thus is omitted here. Many other known configurations may be used for the pulse count circuit 42.

Figure 5:
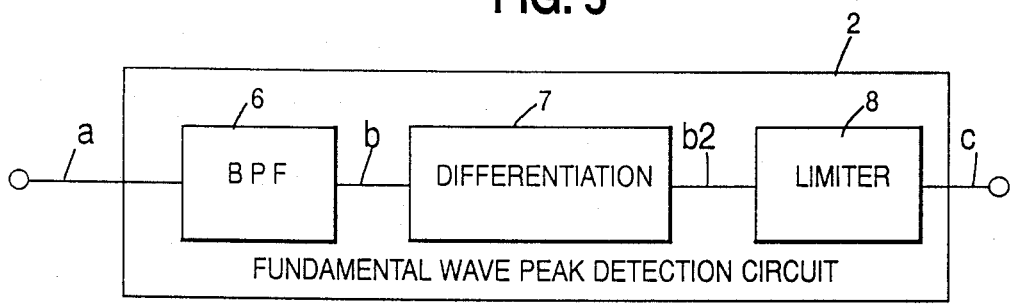
FIG. 5 is a block diagram of a fundamental wave peak detection circuit in the first embodiment.
Figure 6:
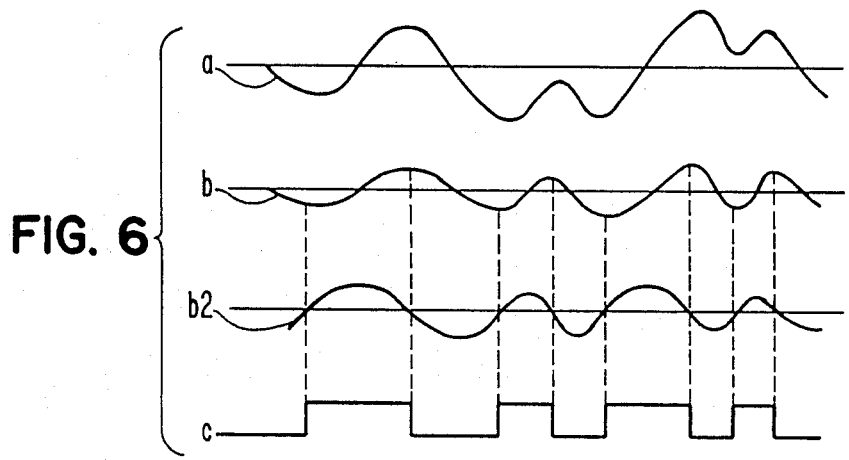
FIG. 6 is a waveform diagram of the fundamental wave peak detection circuit in the first embodiment.

FIG. 5 shows a first example of the fundamental wave peak detection circuit 2, which detects the peak points of the fundamental wave, and FIG. 6 shows waveforms in the circuit of FIG. 5. The input FM signal a is passed through a band-pass filter (BPF) 6 so as to extract the FM fundamental wave b. Here, the pass band of the BPF is roughly set to cover the deviation of the FM signal. Then, in order to detect the peak points of the signal b, the signal b is differentiated by a differentiation circuit 7 to obtain a signal b2. Here, the zero cross points of the signal b2 indicate the peak points of the signal b. In a limiter circuit 8, a signal c can be obtained by limiting the signal b2.

Figure 7A:
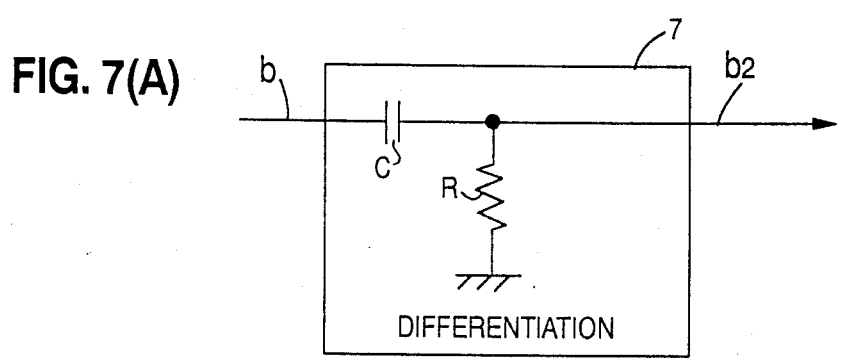
FIGS. 7 (A) and (B) are circuit diagrams of a differentiation circuit in the fundamental wave peak detection circuit.
Figure 7:
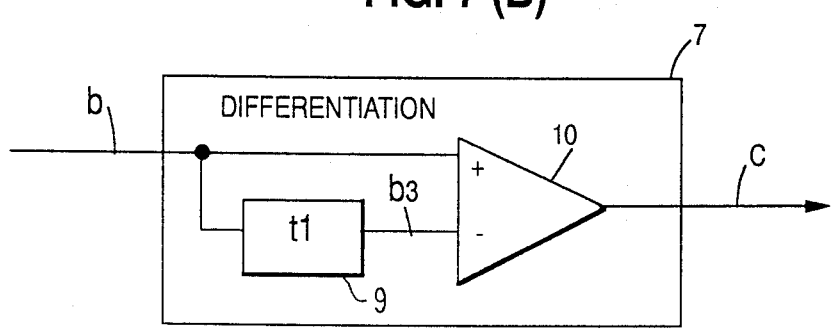

FIG. 7 (A) shows an example of the differentiation circuit 7. The differentiation circuit in FIG. 7 (A) comprises a resistor R and a capacitor C. In this arrangement, the order of the BPF6 and the differentiation circuit 7 may be reversed.

Figure 8:
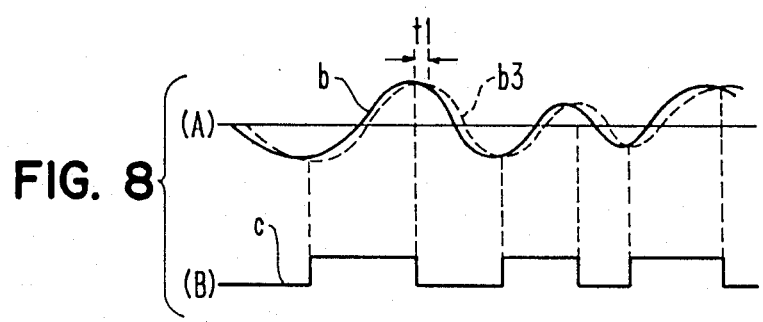
FIG. 8 is a waveform diagram of the differentiation circuit of FIG. 7 (B)

Another example of the differentiation circuit 7 is shown in FIG. 7 (B), in which the differentiation circuit comprises a delay circuit 9 which delays the signal b by a minute time $t_1$ to obtain a signal b3 and a comparator 10. The operation of the circuit in FIG. 7 (B) will be described by using waveform diagrams shown in FIG. 8. The FM fundamental wave b and the signal b3 which is delayed from the signal b by $t_1$ are compared by the comparator 10 to obtain the signal c. In this case, the transition edges of the signal c is shifted from the peak points of the signal b by the minute time $t_1$, but the shift amount is practically ignorable because the time $t_1$ is minute (for example, the time $t_1$ is 20 nsec). If this arrangement is used in the differentiation circuit 7, there is an advantage that the limiter circuit 8 in FIG. 5 can be omitted.

Figure 9:
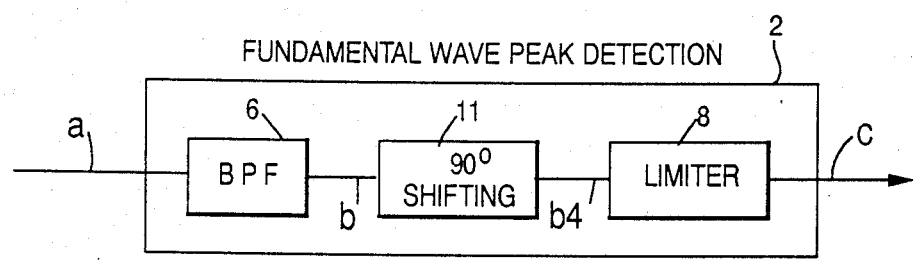
FIG. 9 is a block diagram of another fundamental wave peak detection circuit of the present invention.
Figure 11:
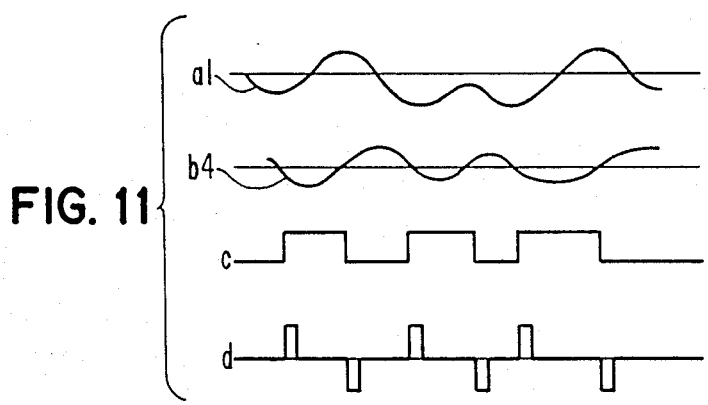
FIG. 11 is a waveform diagram of the circuit in FIG. 9 and the second embodiment in FIG. 10.

A second example of the fundamental wave peak detection circuit 2 shown in FIG. 9 will be described with reference to waveform diagrams shown in FIG. 11. The FM fundamental wave b is taken out from the FM signal a by the BPF6. In a 90° shifting circuit 11, the phase of the signal b is shifted by 90° in a band where the fundamental wave b exists. As a result of this, a signal b4 can be obtained. The zero cross points of the signal b4 are in agreement with the peak points of the signal b. In other words, by limiting the signal b4 by the limiter circuit 8, it is possible to obtain the signal c. Here, the 90° shifting circuit 11 can be composed of a capacitor and a resistor.

Figure 10:
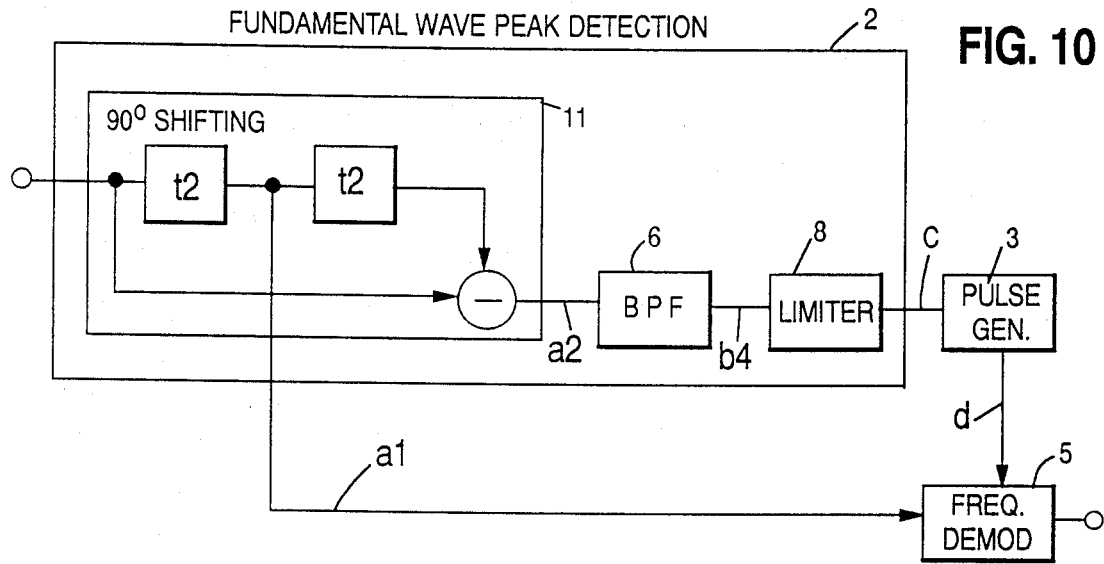
FIG. 10 is a block diagram of a second embodiment of the present invention.

It is also possible to compose the 90° shifting circuit with a delay element as shown in FIG. 10 which is a second embodiment of the present invention. The 90° shifting circuit 11 shown in FIG. 10 is a kind of a comb line filter, in which the phase difference between a signal a1 which is delayed by a time $t_2$ and a signal a2 which is produced by synthesizing the input FM signal a and a signal delayed from the signal a by a time $2t_2$ is always 90°. The signal a1 is sent to the frequency demodulator 5. The signal a2 is sent to the BPF6 to obtain the fundamental wave b4. The zero cross points of the fundamental wave b4 are in agreement with the peak points of the signal a1. Thus, by limiting the signal b4 by the limiter circuit 8, it is possible to obtain the signal c. In the arrangement shown in FIG. 10 because the input FM signal is also delayed by $t_2$, the arrangement thereof is somewhat different from the block diagram shown in FIG. 1. This difference resulted from the arrangement of the 90° shifting circuit is not an essential difference.

Figure 12:
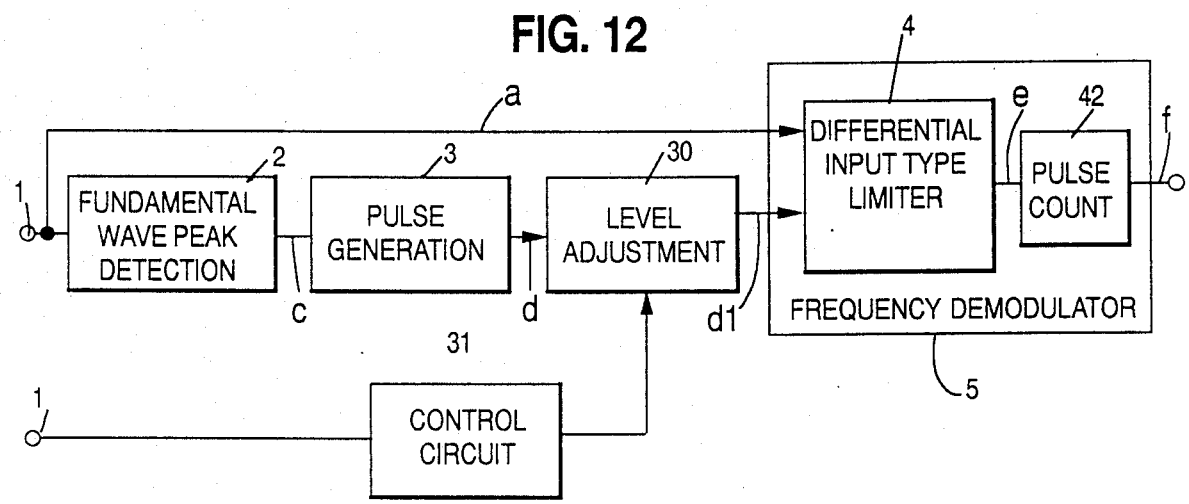
FIG. 12 is a block diagram of a third embodiment of the present invention.
Figure 13:
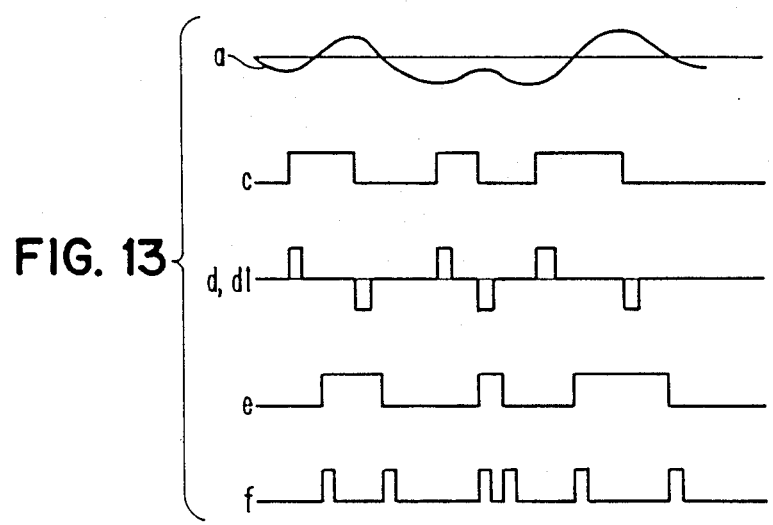
FIG. 13 is a waveform diagram of the third embodiment.

FIG. 12 shows a block diagram of a third embodiment of the present invention, and FIG. 13 shows waveforms in the FIG. 12 block diagram. An FM signal a inputted from a terminal 1 is fed into a fundamental wave peak detection circuit 2. The fundamental wave peak detection circuit 2 outputs a rectangular signal c whose transition edges indicate the peak points of the fundamental wave component b of the FM signal. A pulse generation circuit 3 generates from the signal c, pulses d of positive polarity at the rising edges of the signal c and negative polarity at the falling edges of the signal c. The pulse generation circuit 3 may be a differentiation circuit. The pulses d are adjusted in level by a level adjusting circuit 30 to be d1 and sent to the frequency demodulator 5. The level adjustment circuit 30 is controlled by a control circuit 31. The control circuit 31 and a signal inputted thereto through a terminal 100 will be described later. The frequency demodulator 5 operates in the same way as described before. The differential input type limiter circuit 4 receives the input FM signal a and the pulse train $d_1$ from the level adjustment circuit 30, and outputs the signal e. The pulse count circuit 42 produces the frequency-demodulated signal f from the signal e. The features of the embodiment shown in FIG. 12 is that the levels of the pulses applied as the varying reference signal to the differential input type limiter circuit 4 are controlled properly according to the system in which the frequency demodulation circuit is used.

An example of the level adjustment circuit 30 is shown in FIG. 14, in which the level adjustment circuit comprises resistors R1, R2, and a FET 32. The output signal of the pulse generation circuit 3 is inputted through a terminal 34, and a small level is outputted form a terminal 35 when the signal from the control circuit 31 inputted through a terminal 33 is high, while a large level is outputted from the terminal 35 when the signal from the control circuit 31 is low.

Figure 15E:
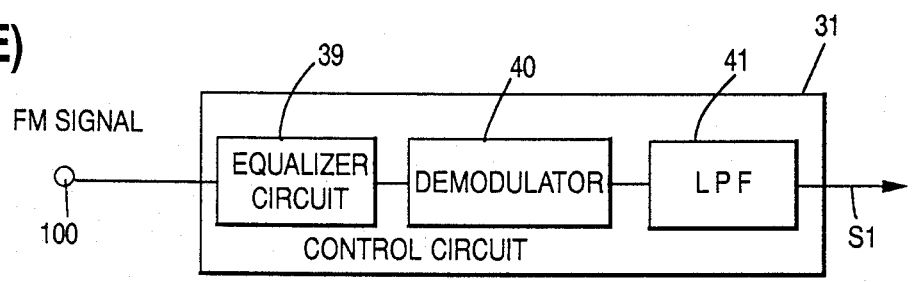
FIGS. 15 (A)–(E) are block diagrams of a control circuit and FIG. 15 (F) is a waveform diagram of a 100% white signal.
Figure 15F:
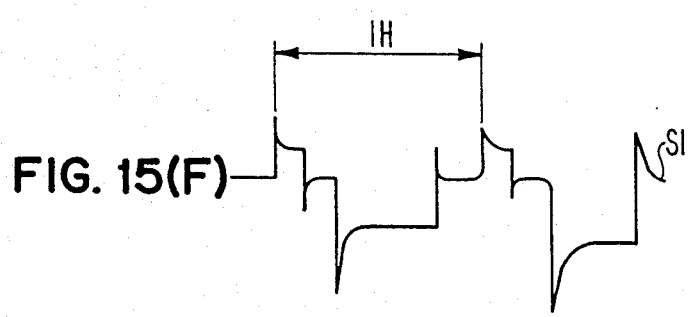

Now, examples of the control circuit 31 are shown in FIGS. 15 (A) through (E).

The control circuit shown in FIG. 15 (A) uses the recording time mode signal set in a recording and reproducing apparatus as the input signal, and outputs a low signal in the long time recording mode, thereby controlling the level adjustment circuit so as to increase the addition level.

The control circuit shown in FIG. 15 (B) uses, as the input signal, the high band recording mode signal which indicates the normal FM carrier frequency which is set in a recording and reproducing apparatus or the high band FM carrier frequency which is shifted to the high band, and outputs a low signal in the high band mode, thereby controlling the level adjustment circuit so as to increase the addition level.

The control circuit shown in FIG. 15 (C) is composed of a detection circuit 36 which detects the amplitude level of the FM signal, and outputs a low signal when the amplitude level of the FM signal is small, thereby controlling the level adjustment circuit so as to increase the addition level.

The control circuit shown in FIG. 15 (D) is composed of a low pass filter 37 which passes the lower side-band of the FM signal and a detection circuit 38 which detects the lower side-band level, and outputs a low signal when the lower side-band level is large, thereby controlling the level adjustment circuit so as to increase the addition level.

The control circuit shown in FIG. 15 (E) is composed of an equalizer circuit 39 which emphasizes only the fundamental wave component of the FM signal, a demodulator 40 which demodulates the output of the equalizer circuit 39, and a low pass filter 41 which passes the low band component of the output of the demodulator, thereby controlling the output S1 so as to increase the addition level when the output signal level of the low pass filter approaches closer to a level indicating that the FM signal is in high band. The equalizer is inserted to prevent the inversion phenomenon from generating in the demodulator. If the carrier frequency of the white level of a video signal is modulated higher than the carrier frequency of the black level of the video signal, the closer the image signal is to the white level of the signal demodulated in the demodulator, the output S1 of the control circuit 31 becomes lower. A signal waveform which is not provided with deemphasis is desirable. FIG. 15 (F) shows a waveform when the video signal is 100% white.

In the embodiments described above, the BPF6, which is an element of the fundamental wave peak detection circuit 2, is effective to improve S/N (or C/N in a recording and reproducing apparatus). The S/N improvement effect is enhanced by narrowering the pass band of the BPF6. However, if the band is made too narrow to pass the FM fundamental wave, the detection of the peaks of the fundamental wave becomes incomplete. Therefore, according to the carrier frequency of the FM signal and conditions of S/N, it is preferable to employ an adaptive control so that the band width of the BPF becomes optimum. The information to be used for the adaptive control may be the output level of the FM signal, the recording mode of a recording and reproducing apparatus (in a VTR for example, a standard recording, a long time recording or a standard recording, a high band recording), or the like.

Figure 16:
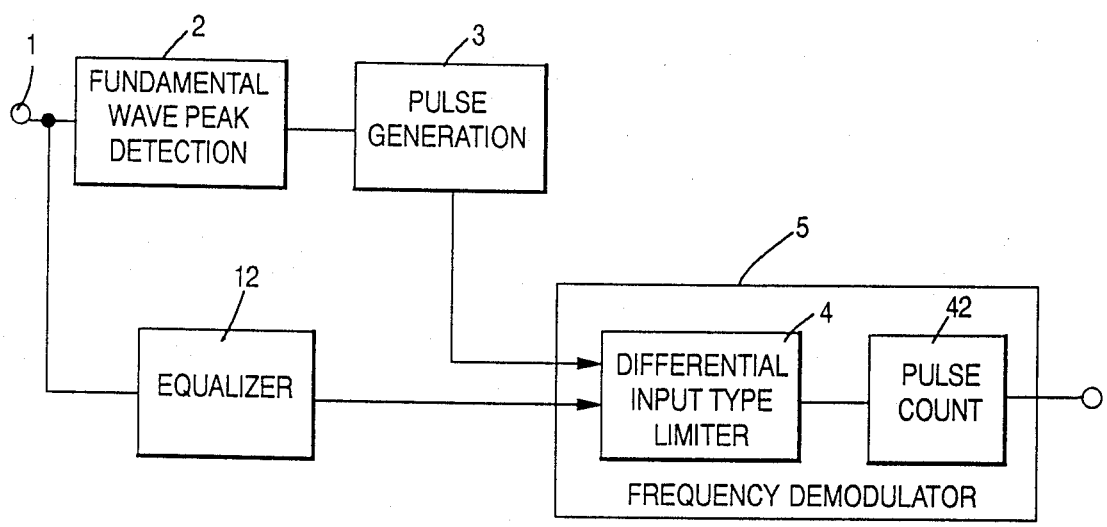
FIGS. 16 and 17 are block diagrams of other embodiments of the present invention.
Figure 17:
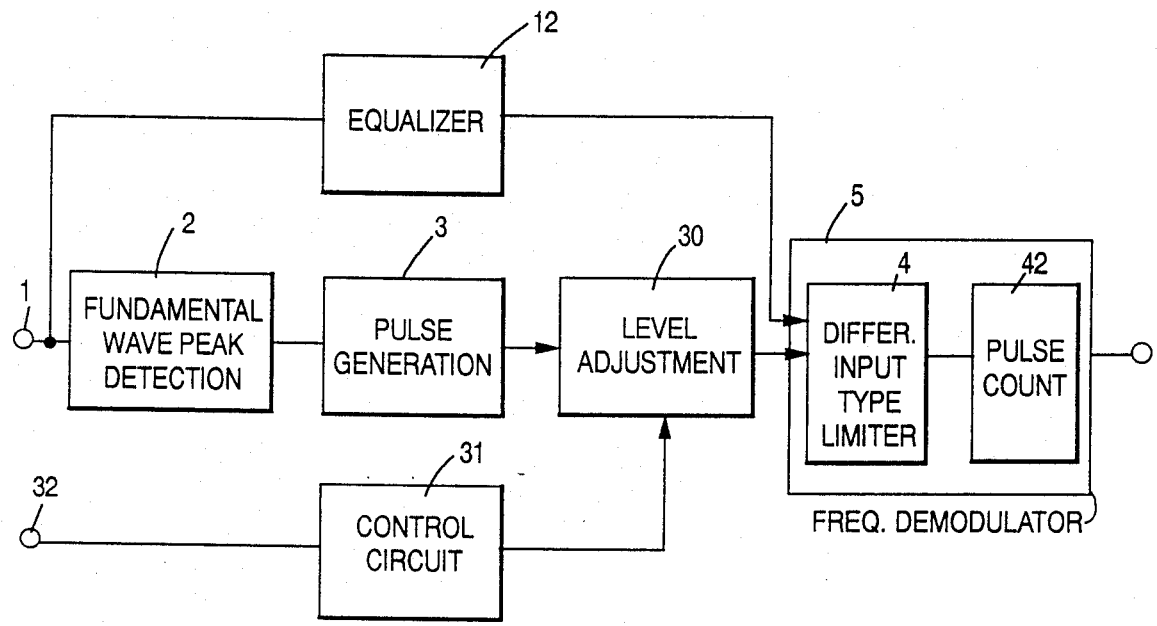
Figure 18:
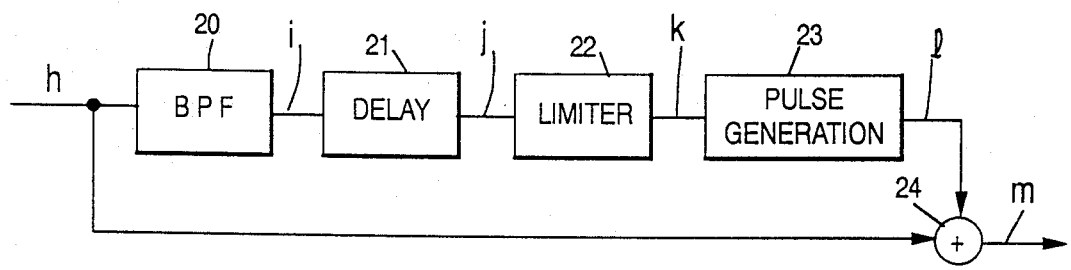
FIG. 18 is a block diagram of a conventional example.
Figure 19:
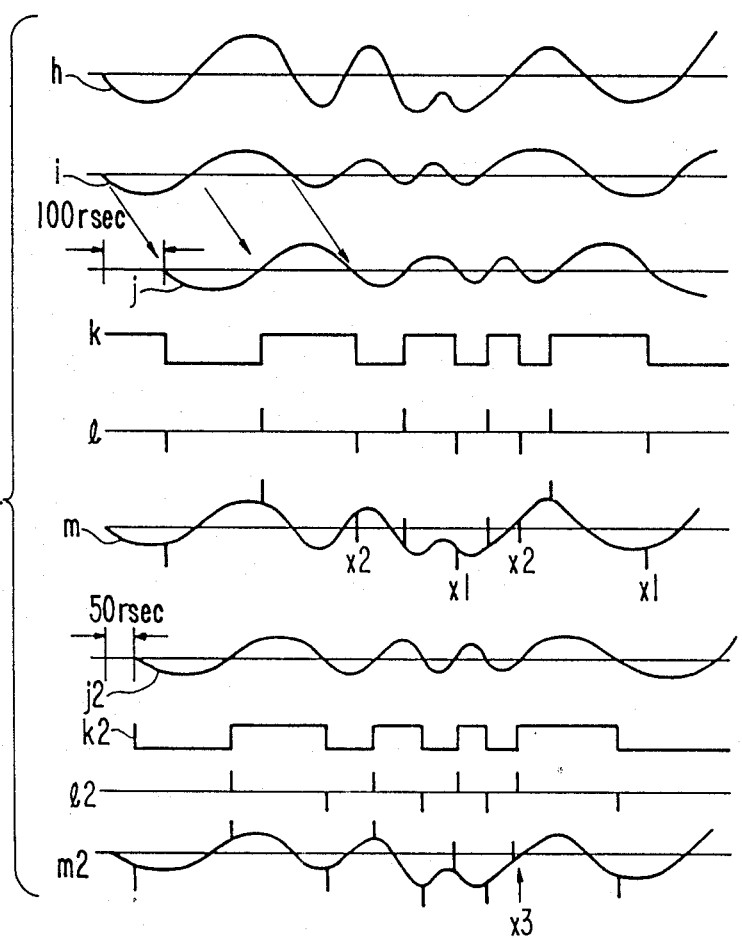
FIG. 19 is a waveform diagram of the conventional example.

Further, a minute delay would be caused due to the operation of the circuits or the filter in the fundamental wave peak detection circuit 2 and the pulse generation circuit 3. Therefore, as shown in FIGS. 16 and 17, to compensate for such minute delay, it is preferable to insert an equalizer circuit 12 in the direct FM signal path from the terminal 1 to the frequency demodulator 5. It is desirable for the equalizer circuit 12 that the group delay frequency characteristic is constant and the frequency characteristic is flat. However, from the aspect of S/N improvement, the equalizer circuit 12 may have a low pass filter characteristic which attenuates the high band component, having poor S/N, of the FM signal.

Conventionally, an improvement of S/N by attenuation of high band component of the FM signal in a stage before the demodulator 5 has been known, but the attenuation amount could not be made adequately large because the inversion phenomenon often took place when the attenuation amount was large. However, according to the present invention, it is possible not to cause the inversion phenomenon to generate while the attenuation amount of the high band of the equalizer 12 is made large enough to effectively improve S/N. That is to say, the present invention has an advantage of the S/N improvement as the secondary effect.

Furthermore, in the first embodiment of the detection circuit 2, it is also possible to widen the band width of the BPF6 so as to pass the FM side band wave or to remove the BPF6 so as to directly detect the peak points of the FM signal having the side band wave by the differentiation circuit 7. In this case however, because there is no band restriction, there is no effect of the S/N improvement, so that the reliability of the output signal c of the limiter circuit 8 becomes lower than that of the embodiments described above. To enhance the S/N improvement effect, it is desirable that the band of the BPF6 is as narrow as possible while containing a high band of deviation from the carrier center of the FM signal.

Incidently, from another point of view, the pulses d which are to be applied to the differential input time limiter circuit 4 is a higher harmonic signal containing odd harmonic components of the fundamental wave of the FM signal higher than a specific order. Therefore, the circuit constituted by the fundamental wave peak detection circuit 2 and the pulse generation circuit 3 can be called a higher harmonic signal generating circuit.

The frequency demodulation circuit of the present invention as described hereinabove with reference to some preferred embodiments can be used in a variety of systems which employ frequency modulation, including audio and/or video signal recording and reproducing systems which record audio and/or video signals in the form of frequency-modulated signals on a recording medium and reproduce the recorded signal.

Although some preferred embodiments have been described, they have been shown for the aid of better understanding of the invention. It should be understood that various changes and modifications may be made within the scope of the invention solely defined in the appended claims.

What is claimed:
1. A frequency demodulation circuit comprising:
    a peak detection circuit for detecting peaks of an input frequency-modulated signal;
    a pulse generating circuit for generating, according to the detection result by the peak detection circuit, pulses respectively occurring at timings at which the peaks occur, polarities of the pulses being opposite to polarities of the respective corresponding peaks;
    a differential input type limiter circuit which receives at its differential input terminals the input frequency-modulated signal and the train of pulses respectively for limiting the input frequency-modulated signal with the train of pulses as a reference signal; and
    a pulse count circuit for producing a pulse having a predetermined width at each edge of pulses outputted from the differential input type limiter circuit, thereby to obtain a frequency-demodulated signal.

2. A frequency demodulation circuit as claimed in claim 1, further comprising an equalizer for delaying the input frequency-modulated signal before being fed to the differential input type limiter circuit so as to compensate for a signal delay caused in the peak detection circuit and the pulse generating circuit.

3. A frequency demodulation circuit as claimed in claim 2; wherein the equalizer has a low-pass filter characteristic so as to eliminate high frequency band components of the input frequency-modulated signal having low signal to noise ratio.

4. A frequency demodulation circuit as claimed in claim 1, wherein the peak detection circuit produces from the input frequency-modulated signal a rectangular waveform signal whose level transition timings correspond to the peaks of the input frequency-modulated signal, and the pulse generating circuit generates the pulses respectively at the level transition timings of the rectangular wave-form signal.

5. A frequency demodulation circuit as claimed in claim 4, wherein the pulse generating circuit comprises a differentiation circuit which differentiates the rectangular waveform signal.

6. A frequency demodulation circuit as claimed in claim 4, wherein the peak detection circuit comprises: a differentiation circuit for differentiating the input frequency-modulated signal to obtain a signal whose zero cross points correspond to the peaks of the input frequency-modulated signal; and a limiter for limiting the level of the signal outputted from the differentiation circuit thereby to obtain the rectangular waveform signal.

7. A frequency demodulation circuit as claimed in claim 4, wherein the peak detection circuit comprises: a delay circuit for delaying the input frequency-modulated signal by a minute time to obtain a minutely delayed frequency-modulated signal; and a comparator for comparing levels of the input frequency-modulated signal and the minutely delayed frequency-modulated signal thereby to obtain a signal substantially the same as the rectangular waveform signal.

8. A frequency demodulation circuit as claimed in claim 4, wherein the peak detection circuit comprises: a phase shifting circuit for shifting the phase of the input frequency-modulated signal by 90° to obtain a 90° phase shifted frequency-modulated signal whose zero cross points correspond to the peaks of the input frequency-modulated signal; and a limiter for limiting the level of the 90° phase shifted frequency-modulated signal thereby to obtain the rectangular waveform signal.

9. A frequency demodulation circuit as claimed in claim 1, further comprising a level adjusting circuit inserted between the pulse generating circuit and the differential input type limiter circuit for adjusting the level of the pulses generated by the pulse generating circuit to be a predetermined level according to a predetermined control signal.

10. A frequency demodulation circuit comprising:
    a fundamental wave peak detection circuit for detect peaks of a fundamental wave of an input frequency-modulated signal;
    a pulse generating circuit for generating, according to the detection result by the peak detection circuit, a train of pulses respectively occurring at timings at which the peaks occur, polarities of the pulses being opposite to polarities of the respective corresponding peaks;
    a differential input type limiter circuit which receives at its differential input terminals the input frequency-modulated signal and the train of pulses respectively for limiting the input frequency-modulated signal with the train of pulses as a reference signal; and a pulse count circuit for producing a pulse having a predetermined width at each edge of pulses outputted from the differential input type limiter circuit, thereby to obtain a frequency-demodulated signal.

11. A frequency demodulation circuit as claimed in claim 10, further comprising an equalizer for delaying the input frequency-modulated signal before being fed to the differential input type limiter circuit so as to compensate for a signal delay caused in the peak detection circuit and the pulse generating circuit.

12. A frequency demodulation circuit as claimed in claim 11, wherein the equalizer has a low-pass filter characteristic so as to eliminate high frequency band components of the input frequency-modulated signal having low signal to noise ratio.

13. A frequency demodulation circuit as claimed in claim 10, wherein the fundamental wave peak detection circuit produces from the input frequency-modulated signal a rectangular waveform signal whose level transition timings correspond to the peaks of the fundamental wave, and the pulse generating circuit generates the pulses respectively at the level transition timings of the rectangular waveform signal.

14. A frequency demodulation circuit as claimed in claim 13, wherein the pulse generating circuit comprises a differentiation circuit which differentiates the rectangular waveform signal.

15. A frequency demodulation circuit as claimed in claim 13, wherein the fundamental wave peak detection circuit comprises:
   a band-pass filter for extracting the fundamental wave from the input frequency-modulated signal;
   a differentiation circuit for differentiating the fundamental wave to obtain a signal whose zero cross points correspond to the peaks of the fundamental wave; and
   a limiter for limiting the level of the signal outputted from the differentiation circuit thereby to obtain the rectangular waveform signal.

16. A frequency demodulation circuit as claimed in claim 13, wherein the fundamental wave peak detection circuit comprises:
   a band-pass filter for extracting the fundamental wave from the input frequency-modulated signal;
   a delay circuit for delaying the fundamental wave by a minute time to obtain a minutely delayed fundamental wave; and
   a comparator for comparing levels of the fundamental wave and the minutely delayed fundamental wave thereby to obtain a signal substantially the same as the rectangular waveform signal.

17. A frequency demodulation circuit as claimed in claim 13, wherein the fundamental wave peak detection circuit comprises:
   a band-pass filter for extracting the fundamental wave from the input frequency-modulated signal;
   a phase shifting circuit for shifting the phase of the fundamental wave by 90° to obtain a 90° phase shifted fundamental wave whose zero cross points correspond to the peaks of the fundamental wave; and
   a limiter for limiting the level of the 90° phase shifted fundamental wave thereby to obtain the rectangular waveform signal.

18. A frequency demodulation circuit comprising:
   a fundamental wave peak detection circuit for detecting peaks of a fundamental wave of an input frequency-modulated signal;
   a pulse generating circuit for generating, according to the detection result by the peak detection circuit, a train of pulses respectively occurring at timings at which the peaks occur, polarities of the pulses being opposite to polarities of the respective corresponding peaks;
   a level adjusting circuit for adjusting the level of the train of pulses generated by the pulse generating circuit;
   a control circuit for controlling the level adjusting circuit according to a predetermined signal;
   a differential input type limiter circuit which receives at its differential input terminals the input frequency-modulated signal and the level-adjusted train of pulses from the level adjusting circuit respectively for limiting the input frequency-modulated signal with the level-adjusted train of pulses as a reference signal; and
   a pulse count circuit for producing a pulse having a predetermined width at each edge of pulses outputted from the differential input type limiter circuit, thereby to obtain a frequency-demodulated signal.

19. A frequency demodulation circuit as claimed in claim 18, further comprising an equalizer for delaying the input frequency-modulated signal before being fed to the differential input type limiter circuit so as to compensate for a signal delay caused in the peak detection circuit, the pulse generating circuit and the level adjusting circuit.

20. A frequency demodulation circuit as claimed in claim 19, wherein the equalizer has a low-pass filter characteristic so as to eliminate high frequency band components of the input frequency-modulated signal having low signal to noise ratio.

21. A frequency demodulation circuit as claimed in claim 18, wherein the fundamental wave peak detection circuit produces from the input frequency-modulated signal a rectangular waveform signal whose level transition timings correspond to the peaks of the fundamental wave, and the pulse generating circuit generates the pulses respectively at the level transition timings of the rectangular waveform signal.

22. A frequency demodulation circuit as claimed in claim 21, wherein the pulse generating circuit comprises a differentiation circuit which differentiates the rectangular waveform signal.

23. A frequency demodulation circuit as claimed in claim 21, wherein the fundamental wave peak detection circuit comprises:
   a band-pass filter for extracting the fundamental wave from the input frequency-modulated signal;
   a differentiation circuit for differentiating the fundamental wave to obtain a signal whose zero cross points correspond to the peaks of the fundamental wave; and
   a limiter for limiting the level of the signal outputted from the differentiation circuit thereby to obtain the rectangular waveform signal.

24. A frequency demodulation circuit as claimed in claim 21, wherein the fundamental wave peak detection circuit comprises:
   a band-pass filter for extracting the fundamental wave from the input frequency-modulated signal;
   a delay circuit for delaying the fundamental wave by a minute time to obtain a minutely delayed fundamental wave; and
   a comparator for comparing levels of the fundamental wave and the minutely delayed fundamental wave thereby to obtain a signal substantially the same as the rectangular waveform signal.

25. A frequency demodulation circuit as claimed in claim 21, wherein the fundamental wave peak detection circuit comprises:
a band-pass filter for extracting the fundamental wave from the input frequency-modulated signal;
a phase shifting circuit for shifting the phase of the fundamental wave by 90° to obtain a 90° phase shifted fundamental wave whose zero cross points correspond to the peaks of the fundamental wave; and
a limiter for limiting the level of the 90° phase shifted fundamental wave thereby to obtain the rectangular waveform signal.

26. A frequency demodulation circuit as claimed in claim 18, wherein the control circuit comprises a detection circuit which receives the input frequency-modulated signal as the predetermined signal for detecting an amplitude level of the input frequency-modulated signal, and the level adjusting circuit is responsive to the detected amplitude level for increasing the level of the train of pulses outputted from the pulse generating circuit as the detected amplitude level decreases.

27. A frequency demodulation circuit as claimed in claim 18, wherein the control circuit receives the input frequency-modulated signal as the predetermined signal and comprises: a low-pass filter for extracting a lower side band signal from the input frequency-modulated signal; and a detection circuit for detecting an amplitude level of the lower side band signal, and
wherein the level adjusting circuit is responsive to the detected amplitude level for increasing the level of the train of pulses outputted from the pulse generating circuit as the detected amplitude level increases.

28. A frequency demodulation circuit as claimed in claim 18, wherein the control circuit receives the input frequency-modulated signal as the predetermined signal and comprises: an equalizer for emphasizing only the fundamental wave of the input frequency-modulated signal; a demodulator for demodulating an output signal from the equalizer; and a low-pass filter for passing a low frequency component of an output signal from the demodulator, and
wherein the level adjusting circuit is responsive to an output signal from the low-pass filter for increasing the level of the train of pulses outputted from the pulses generating circuit as the level of the output signal from the low-pass filter varies in a direction indicating that the frequency of the fundamental wave is in a high band.

29. A frequency demodulation circuit as claimed in claim 18 used in a signal recording and reproducing apparatus, wherein the control circuit receives as the predetermined signal a signal indicating a recording time mode of the apparatus, and controls the level adjusting circuit so as to increase the level of the train of pulses outputted from the pulse generating circuit when the recording time mode is a long recording time mode.

30. A frequency demodulation circuit as claimed in claim 18 used in a signal recording and reproducing apparatus, wherein the control circuit receives as the predetermined signal a high band recording mode signal indicating whether the carrier frequency of the frequency-modulated signal is a normal frequency set for the apparatus or a higher frequency than the normal frequency, and controls the level adjusting circuit so as to increase the level of the train of pulses outputted from the pulse generating circuit when the carrier frequency is the higher frequency.

31. A frequency demodulation circuit comprising:
a higher harmonic signal generating circuit for generating from a fundamental wave of an input frequency-modulated signal a higher harmonic component signal containing all of the phase-inverted higher odd order harmonic components of the frequency-modulated signal than a predetermined order;
a differential input type limiter circuit which receives at its differential input terminals the input frequency-modulated signal and the higher harmonic component signal respectively for limiting the input frequency-modulated signal with the higher harmonic component signal as a reference signal; and
a pulse count circuit for producing a pulse having a predetermined width at each edge of pulses outputted from the limiter circuit, thereby to obtain a frequency-demodulated signal.

* * * * *